(12) United States Patent
Oh et al.

(10) Patent No.: US 11,812,635 B2
(45) Date of Patent: Nov. 7, 2023

(54) PROTECTION FILM HAVING BASE LAYER OVER ADHESIVE LAYER

(71) Applicant: Samsung Display Co. Ltd., Yongin-si (KR)

(72) Inventors: Young Eun Oh, Hwaseong-si (KR); Jai Ku Shin, Hwaseong-si (KR); Han Sun Ryou, Seoul (KR); So Dam Ahn, Yongin-si (KR); Jang Doo Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 62 days.

(21) Appl. No.: 17/357,990

(22) Filed: Jun. 25, 2021

(65) Prior Publication Data
US 2021/0320279 A1 Oct. 14, 2021

Related U.S. Application Data

(63) Continuation of application No. 16/843,458, filed on Apr. 8, 2020, which is a continuation of application (Continued)

(30) Foreign Application Priority Data

Sep. 19, 2018 (KR) .......................... 10-2018-0112073

(51) Int. Cl.
H10K 50/844 (2023.01)
G06F 1/16 (2006.01)
(Continued)

(52) U.S. Cl.
CPC ......... H10K 50/844 (2023.02); G06F 1/1652 (2013.01); G09F 9/301 (2013.01);
(Continued)

(58) Field of Classification Search
CPC ............. H01L 51/5253; H01L 51/0097; H01L 51/5246; G06F 1/1652; G09F 9/301; H10K 50/844
See application file for complete search history.

(56) References Cited

U.S. PATENT DOCUMENTS 9,793,512 B2 10/2017 Choi et al.
10,429,893 B2 10/2019 Kim et al.
(Continued)

FOREIGN PATENT DOCUMENTS

CN 107221606 9/2017
CN 107976724 5/2018
(Continued)

OTHER PUBLICATIONS

European Office Action—European Application No. 19195826.3 dated Apr. 22, 2022, citing references listed within.
(Continued)

Primary Examiner — Michael Jung
(74) Attorney, Agent, or Firm — CANTOR COLBURN LLP

(57) ABSTRACT

A protection film for an electronic device includes an adhesive layer including a first surface to which an electronic device is attached, and a film layer which contacts a second surface of the adhesive layer and includes at least one member, where a thickness of the adhesive layer satisfies Inequality 1:

$z \leq (5.1x+57.4) \cdot \ln(y) - (14.7x+140.5)$, where z is the thickness of the adhesive layer in terms of micrometers, x is a modulus of a member of the film layer which directly contacts the adhesive layer in terms of gigapascals, and y is a total thickness of the film layer in terms of micrometers.

15 Claims, 7 Drawing Sheets

Related U.S. Application Data

No. 16/396,421, filed on Apr. 26, 2019, now Pat. No. 10,665,816.

(51) Int. Cl.
  *G09F 9/30* (2006.01)
  *H10K 50/842* (2023.01)
  *H10K 77/10* (2023.01)

(52) U.S. Cl.
  CPC ....... *H10K 50/8426* (2023.02); *H10K 77/111* (2023.02); *B32B 2307/54* (2013.01); *B32B 2457/206* (2013.01)

(56) References Cited

U.S. PATENT DOCUMENTS

| | | | |
|---|---|---|---|
| 10,622,581 | B2 | 4/2020 | Hu et al. |
| 10,809,421 | B2 | 10/2020 | Song et al. |
| 11,031,574 | B2 | 6/2021 | Hu et al. |
| 11,104,601 | B2 | 8/2021 | Hu et al. |
| 2012/0171444 | A1 | 7/2012 | Haruta et al. |
| 2012/0326339 | A1 | 12/2012 | Suzuya et al. |
| 2015/0185782 | A1 | 7/2015 | Kim et al. |
| 2015/0207102 | A1 | 7/2015 | Jeong et al. |
| 2017/0200915 | A1* | 7/2017 | Lee .................... G02B 5/3033 |
| 2018/0053817 | A1 | 2/2018 | Kishimoto et al. |
| 2018/0112049 | A1 | 4/2018 | Song et al. |
| 2018/0258332 | A1 | 9/2018 | Song et al. |
| 2018/0284522 | A1 | 10/2018 | Tsuda |

FOREIGN PATENT DOCUMENTS

| | | |
|---|---|---|
| EP | 3136459 | 3/2017 |
| JP | 2016044186 | 4/2016 |
| KR | 1020140015686 | 2/2014 |
| KR | 1020150078001 | 7/2015 |
| KR | 1020150085352 | 7/2015 |
| KR | 1020150088101 | 7/2015 |
| KR | 101579710 | 12/2015 |
| KR | 1020170015021 | 2/2017 |
| KR | 1020170100407 | 9/2017 |
| KR | 1020170109746 | 10/2017 |
| KR | 1020180021291 | 3/2018 |
| KR | 1020180034156 | 4/2018 |
| KR | 1020180044189 | 5/2018 |
| KR | 1020180067648 | 6/2018 |
| WO | 2017160680 | 9/2017 |

OTHER PUBLICATIONS

Extended European Search Report—European Application No. 19195826.3 dated Mar. 10, 2020, citing references listed within.
Korean Notice of Allowance—Korean Application No. 10-2018-0112073 dated Aug. 4, 2022, citing references listed within.
Chinese Office Action—Chinese Application No. CN 201910801674.4 dated Mar. 1, 2022, cinting references listed within.
Korean Office Action—Korean Application No. 10-2018-0112073 dated Apr. 6, 2022, citing references listed within.

\* cited by examiner

PROTECTION FILM HAVING BASE LAYER OVER ADHESIVE LAYER

This application is a continuation of U.S. patent application Ser. No. 16/843,458, filed on Apr. 8, 2020, which claims priority to U.S. patent application Ser. No. 16/396,421, filed on Apr. 26, 2019, which claims priority to Korean Patent Application No. 10-2018-0112073, filed on Sep. 19, 2018, and all the benefits accruing therefrom under 35 U.S.C. § 119, the content of which in its entirety is herein incorporated by reference.

BACKGROUND

1. Field

Exemplary embodiments of the invention relate to a protection film and an electronic device including the same.

2. Description of the Related Art

With an increasing demand for small electronic devices such as smart phones, bendable or foldable electronic devices are being launched for more various applications.

To prevent a damage to a surface of an electronic device as much as possible, a protection film is desired to have high durability. Thus, the protection film is formed to have a rigid property.

SUMMARY

Since an electronic device is repeatedly bent or folded and then unfolded during a use, a protection film is easily deformed, or cracking or whitening occurs frequently.

Exemplary embodiments of the invention provide a protection film which has excellent durability for a long period of time even when an electronic device is repeatedly bent or folded and then unfolded and protects a body of the electronic device from external impacts and an electronic device to which the protection film is applied.

However, the invention is not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided a protection film for an electronic device. The protection film for an electronic device includes an adhesive layer including a first surface to which an electronic device is attached, and a film layer which contacts a second surface of the adhesive layer and includes at least one member, where the thickness of the adhesive layer satisfies Inequality 1: $z \leq (5.1x+57.4) \cdot \ln(y) - (14.7x+140.5)$ where z is a thickness of the adhesive layer in terms of micrometers, x is a modulus of a member of the film layer which directly contacts the adhesive layer in terms of gigapascals, and y is a total thickness of the film layer in terms of micrometers.

According to another exemplary embodiment of the invention, there is provided an electronic device. The electronic device includes a body which includes at least one member; and a protection film which is attached onto at least a portion of a surface of the body, where the protection film includes an adhesive layer which includes a first surface attached to the surface of the body and a film layer which contacts a second surface of the adhesive layer and includes at least one member, and a thickness of the adhesive layer satisfies Inequality 2: $z \leq (5.1x+57.4) \cdot \ln(y) - (14.7x+140.5)$, where z is the thickness of the adhesive layer in terms of micrometers, x is a modulus of a member of the film layer which directly contacts the adhesive layer in terms of gigapascals, and y is a total thickness of the film layer in terms of micrometers.

BRIEF DESCRIPTION OF THE DRAWINGS

These and/or other exemplary embodiments will become apparent and more readily appreciated from the following description of the exemplary embodiments, taken in conjunction with the accompanying drawings, in which.

DETAILED DESCRIPTION

Figure 1:
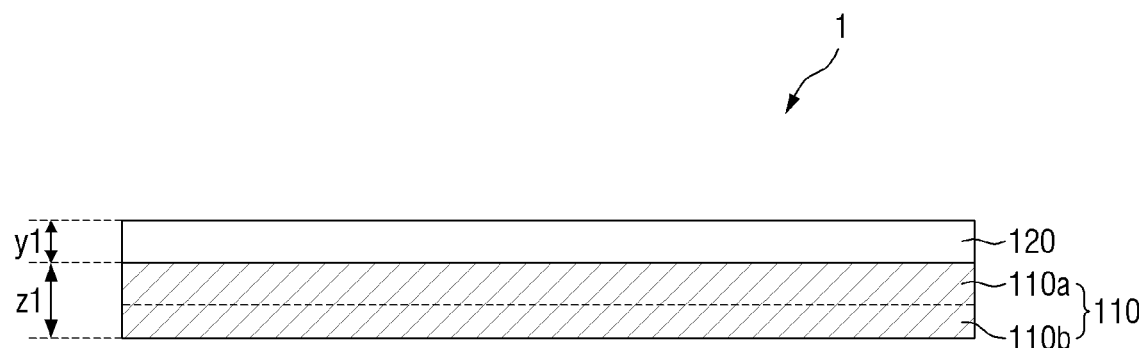
FIG. 1 is a cross-sectional view of an exemplary embodiment of a protection film.

Features of the invention and methods of accomplishing the same may be understood more readily by reference to the following detailed description of embodiments and the accompanying drawings. The invention may, however, be embodied in many different forms and should not be construed as being limited to the exemplary embodiments set forth herein. Rather, these embodiments are provided so that this disclosure will be thorough and complete and will fully convey the concept of the inventive concept to those skilled in the art, and the invention will only be defined by the appended claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An electronic device may be provided as it is, but may also be provided with a protection film attached to at least a portion of the surface of its body to prevent the body from being damaged by an external impact. The electronic device may be, for example, an electronic product including a display panel, such as a smart phone, a tablet computer, a mobile phone, a video phone, an electronic book reader, a desktop computer, a laptop computer, a netbook computer, a workstation, a server, a personal digital assistant ("PDA"), a portable multimedia player ("PMP"), an MP3 player, a mobile medical device, a camera, or a wearable device. In an alternative exemplary embodiment, the electronic device may be a home appliance such as a television, a digital video disk ("DVD") player, an audio player, a refrigerator, an air conditioner, a vacuum cleaner, an oven, a microwave oven, a washing machine, an air purifier, a set-top box, a home automation control panel, a security control panel, a television ("TV") box, a game console, an electronic dictionary, an electronic key, a camcorder, or an electronic picture frame. In an alternative exemplary embodiment, the electronic device may be a medical device (such as various portable medical measuring instruments (including a glucose meter, a heart rate monitor, a blood pressure monitor and a body thermometer), a magnetic resonance angiography ("MRA") device, a magnetic resonance imaging ("MRI") device, a computed tomography ("CT") device, an imaging device or an ultrasonic device), a navigation device, a global navigation satellite system ("GNSS"), an event data recorder ("EDR"), a flight data recorder ("FDR"), an automotive infotainment device, marine electronic equipment (such as a marine navigation device or a gyrocompass), avionics, a security device, an automotive head unit, an industrial or home robot, an automatic teller's machine ("ATM"), a point of sales ("POS") terminal of a shop, or an Internet-of-things ("IoT") device (such as an electric bulb, various sensors, an electric or gas meter, a sprinkler, a fire alarm, a thermostat, a street lamp, a toaster, exercise equipment, a hot water tank, a heater or a boiler).

In various embodiments, the electronic device may be a combination of one or more of the various devices described above. The electronic device according to an exemplary embodiment may be a flexible electronic device or a foldable electronic device.

For ease of description, a foldable organic light emitting display device will be described herein as an example of the electronic device.

A foldable display device may refer to a display device that can be repeatedly folded and unfolded easily regardless of the shape of a panel or a display device that includes two or more panels connected by a coupling medium and can be folded or unfolded using the coupling medium even if the panels themselves cannot be easily folded and unfolded.

The foldable display device may be a liquid crystal display device, a plasma display device, an electrophoretic display device or an electrowetting display device, in addition to the organic light emitting display device mentioned above.

An electronic device according to an exemplary embodiment of the document is not limited to the organic light emitting display device and the above-mentioned devices and may also be a novel electronic device introduced according to technological development.

Hereinafter, embodiments of the disclosure will be described in detail with reference to the accompanying drawings. The same or similar reference numerals are used for the same elements in the drawings. In the drawings, thicknesses are enlarged to clearly indicate layers and regions. In addition, for ease of description, the thicknesses of some layers and regions are exaggerated in the drawings.

Figure 2:
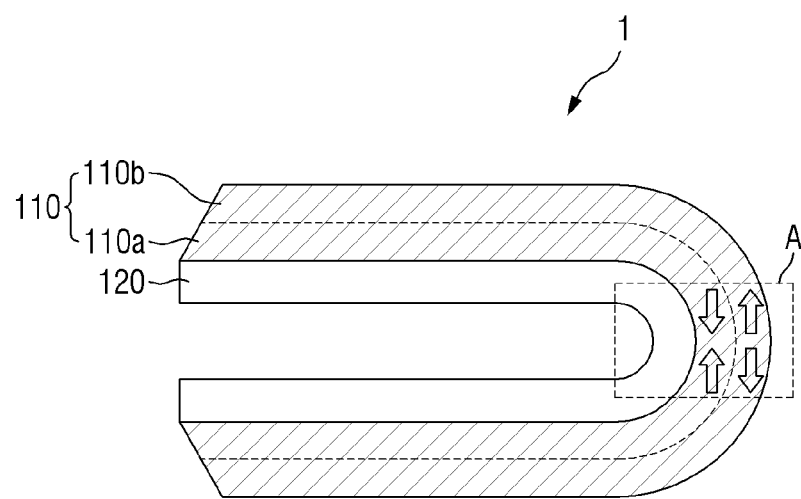
FIG. 2 is a cross-sectional view of the protection film of FIG. 1 in a folded state.
Figure 3:
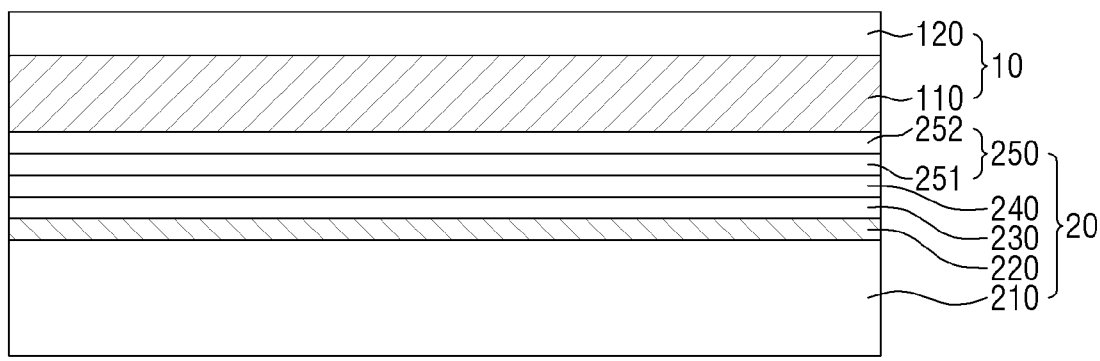
FIG. 3 is a cross-sectional view illustrating the protection film of FIG. 1 attached to an organic light emitting display device.

FIG. 1 is a cross-sectional view of a protection film 10 according to an exemplary embodiment. FIG. 2 is a cross-sectional view of the protection film 10 of FIG. 1 in a folded state. FIG. 3 is a cross-sectional view illustrating the protection film 10 of FIG. 1 attached to an organic light emitting display device 20.

Referring to FIGS. 1 through 3, the protection film 10 is attached onto a surface of the organic light emitting display device 20. Although not illustrated in the drawings, the protection film 10 may also be attached to cover a portion of the organic light emitting display device 20 which includes not only the surface of the organic light emitting display device 20 but also side edges of the surface. The protection film 10 includes a base layer 120 and an adhesive layer 110 disposed on a surface of the base layer 120.

The base layer 120 may be a layer that substantially protects the organic light emitting display device 20 when the protection film 10 is attached to the organic light emitting display device 20. In an exemplary embodiment, the base layer 120 may include at least one of polyethylene terephthalate ("PET"), polyethylene naphthalate ("PEN"), polycarbonate ("PC"), polymethyl methacrylate ("PMMA"), polystyrene, polyvinylchloride, polyethersulfone ("PES"), polyethylene, polypropylene, TRF film, and combinations of these materials, for example.

In an exemplary embodiment, the thickness of the base layer 120 may be about 20 micrometers (μm) or more. In an exemplary embodiment, the thickness of the base layer 120 may be about 25 μm to about 75 μm, for example. By having a thickness within the above range, the base layer 120 may fully protect the surface of the organic light emitting display device 20 without excessively increasing the total thickness of the protection film 10.

The adhesive layer 110 is disposed on a surface of the base layer 120. A surface of the adhesive layer 110 may be an adhesive surface to be attached to the organic light emitting display device 20. The other surface of the adhesive layer 110 may be in contact with the surface of the base layer 120. When the protection film 10 is attached to the organic light emitting display device 20, the adhesive layer 110 may directly contact the organic light emitting display device 20. The adhesive layer 110 disposed between the base layer 120 and the organic light emitting display device 20 includes the function of attaching the base layer 120 to the organic light emitting display device 20. In an exemplary embodiment, the adhesive layer 110 may be provided using an optically clear adhesive ("OCA") such as an acrylic-based adhesive, a silicone-based adhesive, a urethane-based adhesive, a rubber-based adhesive or a vinyl ether-based adhesive or may be provided using a pressure sensitive adhesive ("PSA"), for example. In an exemplary embodiment, the adhesive layer 110 may include a PSA having a modulus of 10 megapascals (MPa) or less at a temperature of −20 degrees Celsius (° C.) or lower.

The adhesive layer 110 may include a first region 110a where compressive stress is generated inside the protection film 10 when the protection film 10 is bent and a second region 110b where tensile stress is generated inside the protection film 10 when the protection film 10 is bent. In an exemplary embodiment, when the protection film 10 is attached to a light emitting surface of the organic light emitting display device 20 and the organic light emitting display device 20 to which the protection film 10 has been attached is bent with the light emitting surface facing inward, compressive stress may be generated in the first region 110a of the adhesive layer 110 which is relatively close to the base layer 120, and tensile stress may be generated in the second region 110b of the adhesive layer 110 which is relatively close to the organic light emitting display device 20, for example.

In the drawings, a boundary between tensile stress and compressive stress generated in the adhesive layer 110 is illustrated as being a midway point between a surface where the adhesive layer 110 contacts the base layer 120 and a surface where the adhesive layer 110 contacts the organic light emitting display device 20. However, the invention is not limited thereto. Depending on the material of the adhesive layer 110, the boundary between the tensile stress and the compressive stress may be provided at a position relatively closer to the surface where the adhesive layer 110 contacts the organic light emitting display device 20 than to the surface where the adhesive layer 110 contacts the base layer 120 or may be provided at a position relatively closer to the surface where the adhesive layer 110 contacts the base layer 120 than to the surface where the adhesive layer 110 contacts the organic light emitting display device 20. That is, the thicknesses of the first region 110a and the second region 110b in the adhesive layer 110 may be the same, the thickness of the first region 110a may be relatively greater than the thickness of the second region 110b, or the thickness of the second region 110b may be relatively greater than the thickness of the first region 110a.

The magnitude of compressive stress in the first region 110a may vary from position to position. The compressive stress may be larger as a position is closer to a relatively bent region (e.g., an A region) in the first region 110a. Similarly, the magnitude of tensile stress in the second region 110b may vary from position to position. The tensile stress may be larger as a position is closer to the relatively bent region in the second region 110b.

When the protection film 10 is bent by applying an external force such that the radius of curvature of the second region 110b is larger than that of the first region 110a as illustrated in FIG. 2, tensile stress may act outside the first region 110a, and compressive stress may act outside the second region 110b. Therefore, when the protection film 10 is bent as illustrated in FIG. 2, side surfaces of the adhesive layer 110 may be inclined. That is, when the protection film 10 is bent as illustrated in FIG. 2, the adhesive layer 110 may be reduced in length from the first region 110a toward the second region 110b due to an external force. Here, since a restoring force is generated inside the adhesive layer 110, compressive stress may be generated inside the first region 110a whose length has been increased compared with that before the application of the external force, and tensile stress may be generated inside the second region 110b whose length has been reduced compared with that before the application of the external force.

The adhesive layer 110 of the protection film 10 according to the illustrated exemplary embodiment has a thickness equal to or smaller than a maximum usable thickness. Thus, buckling may not occur even when the protection film 10 is repeatedly folded and unfolded more than 1000 times. The maximum usable thickness of the adhesive layer 110 will be described in detail later.

In an exemplary embodiment, the protection film 10 may have a light transmittance of about 90 percent (%) or more and a haze of about 1% or less, specifically, a light transmittance of about 91% to about 95% and a haze of about 0.5% to about 0.8%. The protection film 10 may exhibit excellent optical properties by having a light transmittance and a haze within the above ranges. In an exemplary embodiment, the light transmittance may be a value measured according to the conditions of ISO 13468, and the haze may be a value measured according to the conditions of ISO 14782, for example.

In an exemplary embodiment, the base layer 120 of the protection film 10 may have a modulus of about 2 gigapascals (GPa) to about 9 GPa according to the conditions of ASTM D638, for example. By having a modulus within the above range, the base layer 120 may exhibit both sufficient durability and excellent flexibility. In an exemplary embodiment, the base layer 120 may have a modulus of about 2 GPa to about 9 GPa even under a temperature condition of about −40° C. to about 80° C.

More specifically, when the modulus of the base layer 120 is less than about 2 GPa, the protection film 10 may be easily deformed permanently. When the modulus of the base layer 120 is more than about 9 GPa, fissures or cracks may be easily provided in the protection film 10 due to bending or the like.

As described above, the protection film 10 may have excellent optical properties, sufficient durability, and excellent flexibility. Also, even when the protection film 10 is applied to a substrate 210 (including, e.g., a transparent plastic material) of the organic light emitting display device 20, its improved flexibility may prevent breakage or formation of bright dots. Therefore, even when scratches are temporarily generated on the surface of the protection film 10, the surface of the protection film 10 may be restored to its original shape over time due to its elasticity to resist external stimulation or friction.

As a result, since the properties of the protection film 10 are not easily deteriorated despite continuous use, the protection film 10 may maintain excellent optical properties and excellent durability for a long time.

When the base layer 120 of the protection film 10 applied to the organic light emitting display device 20 has a thickness y1, the maximum usable thickness of the adhesive layer 110 may be z1. The thickness of the base layer 120 and the thickness of the adhesive layer 110 will be described later, together with their relationship with the modulus of the base layer 120.

Next, the organic light emitting display device 20 to which the protection film 10 may be attached will be described.

Referring to FIG. 3, the organic light emitting display device 20 may include the substrate 210, an organic light emitting element layer 220 disposed on the substrate 210, an encapsulation layer 230 disposed on the organic light emitting element layer 220, a touch sensing layer 240 disposed on the encapsulation layer 230, and a cover window 250 disposed on the touch sensing layer 240.

The substrate 210 may be a flexible display substrate. The flexible display substrate is characterized by including a flexible material that may be bent or folded. In an exemplary embodiment, the flexible display substrate may include a plastic film such as a polyimide film or may include sheet glass or a thin metal film, for example. However, the invention is not limited thereto, and in another exemplary embodiment, the substrate 210 may also be a rigid display substrate.

The organic light emitting element layer 220 is disposed on the substrate 210. Although not illustrated, a buffer layer may be provided between the substrate 210 and the organic light emitting element layer 220 to flatten an upper surface of the substrate 210 and block the penetration of impurities into the organic light emitting element layer 220.

The organic light emitting element layer 220 may include a plurality of thin-film transistors ("TFTs") and a plurality of organic light emitting diodes ("OLEDs"). Each of the OLEDs may be a structure in which an anode, an organic light emitting layer, and a cathode are sequentially stacked. Source/drain electrodes of some of the TFTs may be electrically connected to the anodes of the OLEDs.

The encapsulation layer 230 is provided over the entire surface of the substrate 210 so as to cover the organic light emitting element layer 220. The encapsulation layer 230 is provided to protect the OLEDs from external moisture, oxygen, or the like. The encapsulation layer 230 may include multiple layers or a single layer including an insulating inorganic material. In an exemplary embodiment, the inorganic material may be a metal oxide or a metal nitride. Specifically, the inorganic material may be silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$), for example. The encapsulation layer 230 may form an encapsulation structure in which a thin film including an organic material and a thin film including an inorganic material are further alternately stacked on a thin film including an insulating organic material.

According to the exemplary embodiment, the organic light emitting display device 20 employing the flexible display substrate 210 and the encapsulation layer 230 made flexible by being provided as a thin film may be bent, folded, or unfolded.

The touch sensing layer 240 may be disposed on the encapsulation layer 230. The touch sensing layer 240 may be an electrostatic capacitive type touch screen panel in an exemplary embodiment. However, the invention is not limited thereto, and in another exemplary embodiment, the touch sensing layer 240 may also be any one of resistive type, electromagnetic type, surface acoustic wave ("SAW") type, and infrared type touch screen panels. Like the flexible display substrate 210, the touch sensing layer 240 uses a flexible material that may be bent or folded. However, the invention is not limited thereto, and in another exemplary embodiment, the touch sensing layer 240 may be omitted.

The cover window 250 is disposed on the touch sensing layer 240. Although not illustrated, the cover window 250 may be attached to the touch sensing layer 240 using an OCA or optically clear resin ("OCR") disposed between the cover window 250 and the touch sensing layer 240.

The cover window 250 may include glass having a high modulus. The modulus of the cover window 250 may be about 50 GPa or more in an exemplary embodiment. The cover window 250 having a high modulus may help prevent buckling from occurring easily even when the adhesive layer 110 of the protection film 10 attached to the cover window 250 becomes thick.

In order to protect itself from damages such as cracks and flaws, the cover window 250 may include a window film 251 and a coating layer 252 disposed on a surface of the window film 251 to lower the probability of a damage of the window film 251. The window film 251 may include a transparent plastic film. In an exemplary embodiment, the plastic film may include, but is not limited to, polyethylene terephthalate, polymethyl methacrylate, polycarbonate, or polyimide, for example.

The material of the cover window 250 is not limited to the above-mentioned glass and, in another exemplary embodiment, the material of the cover window 250 may be a flexible material that enables the organic light emitting display device 20 to be bent, folded, and unfolded.

Light emitted from the organic light emitting element layer 220 may be seen by a user through the cover window 250. The protection film 10 may be attached onto the cover window 250 which is the light emitting surface.

The cover window 250 of the organic light emitting display device 20 described above may be easily damaged by an external impact even when it includes the coating layer 252. Therefore, the protection film 10 is attached onto the cover window 250 so as to prevent the organic light emitting display device 20 from being easily damaged by an external impact.

Next, the bonding relationship between the base layer 120 and the adhesive layer 110 will be described.

Figure 4:
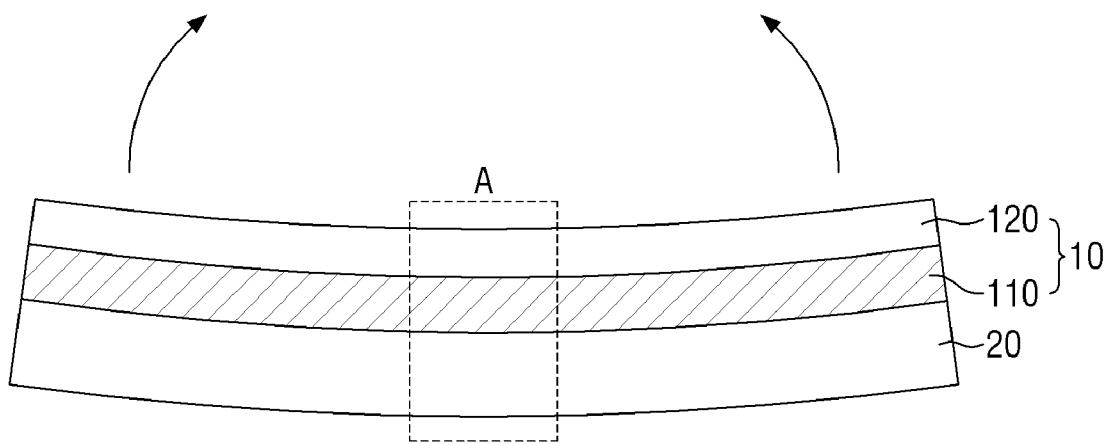
FIG. 4 is a cross-sectional view illustrating a process in which the organic light emitting display device to which the protection film of in FIG. 1 has been attached is folded.
Figure 5:
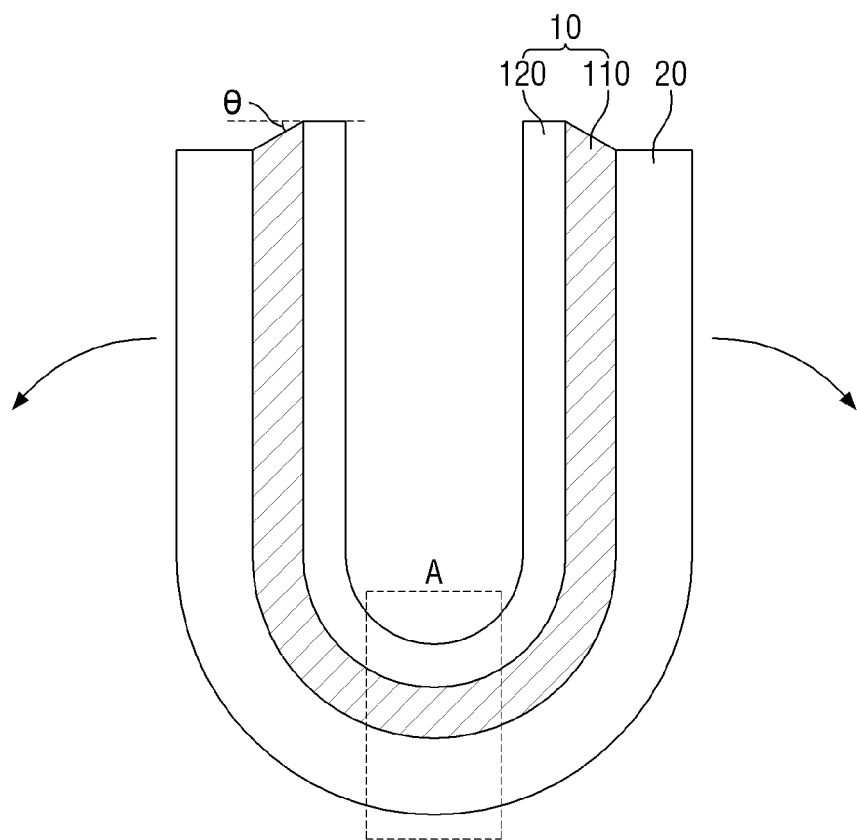
FIG. 5 is a cross-sectional view illustrating a process in which the organic light emitting display device to which the protection film of FIG. 1 has been attached is unfolded.
Figure 6:
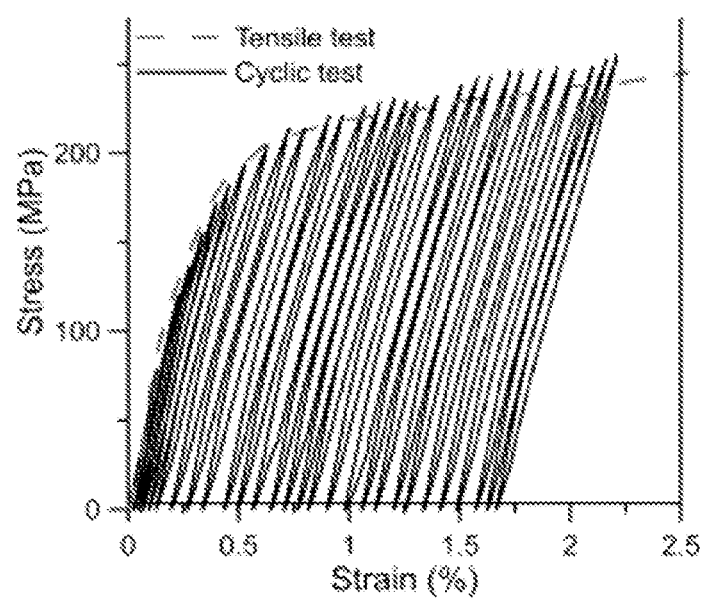
FIG. 6 is a graph illustrating the amount of tensile stress according to the strain of an adhesive layer in an A region when the processes of FIGS. 4 and 5 are repeated.
Figure 7:
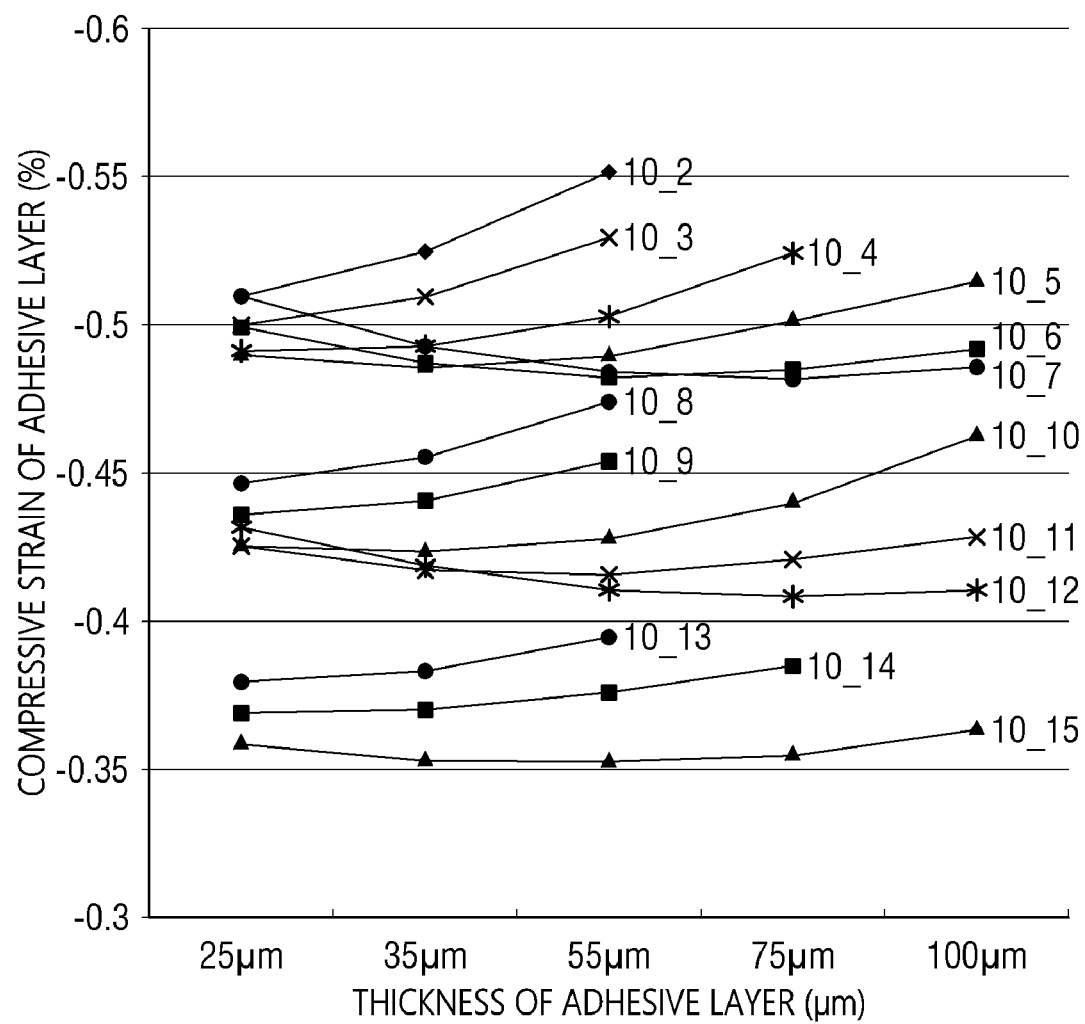
FIG. 7 is a graph illustrating the strain of the adhesive layer according to the thickness of the adhesive layer for each thickness of a base layer.
Figure 8:
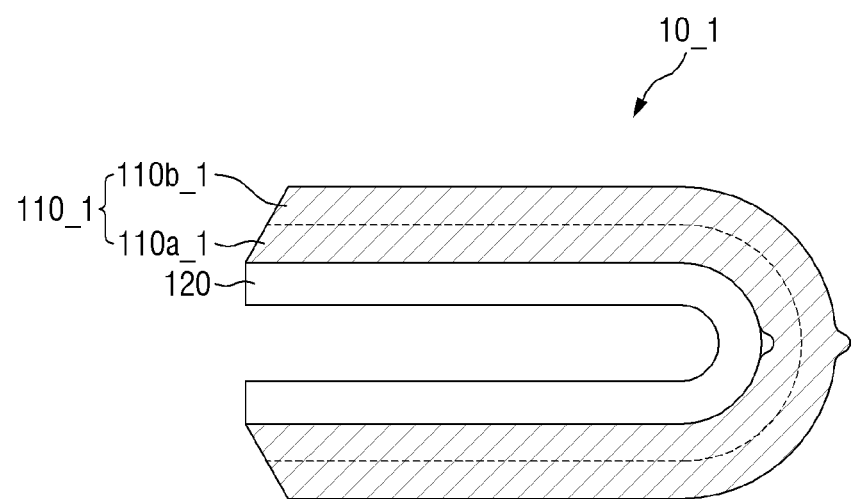
FIG. 8 is a cross-sectional view illustrating, as a comparative example, a folded protection film to which an adhesive layer having a thickness exceeding a maximum usable thickness has been applied.

FIG. 4 is a cross-sectional view illustrating a process in which the organic light emitting display device 20 to which the protection film 10 of in FIG. 1 has been attached is folded. FIG. 5 is a cross-sectional view illustrating a process in which the organic light emitting display device 20 to which the protection film 10 of FIG. 1 has been attached is unfolded. FIG. 6 is a graph illustrating the amount of tensile stress according to the strain of the adhesive layer 110 in the A region when the processes of FIGS. 4 and 5 are repeated. FIG. 7 is a graph illustrating the strain of the adhesive layer 110 according to the thickness of the adhesive layer 110 for each thickness of the base layer 120. FIG. 8 is a cross-sectional view illustrating, as a comparative example, a folded protection film 10_1 to which an adhesive layer 110_1 having a thickness exceeding the maximum usable thickness has been applied.

Referring to FIGS. 4 and 5, as described above, the organic light emitting display device 20 may be a foldable display device 20, and the protection film 10 according to the exemplary embodiment may be attached onto the foldable display device 20. The organic light emitting display device 20 may be folded and unfolded in the A region. When the organic light emitting display device 20 is folded and unfolded in the A region, the protection film 10 attached onto the organic light emitting display device 20 may also be folded and unfolded in the A region, like the organic light emitting display device 20.

A direction in which the organic light emitting display device 20 is folded may be a direction in which the light emitting surface faces inward. That is, when the protection film 10 is attached onto the cover window 250 of the organic light emitting display device 20, the organic light emitting display device 20 may be folded such that the radius of curvature becomes greater in the order of the base layer 120, the adhesive layer 110, the cover window 250 and the substrate 210 in the A region.

When the protection film 10 is folded to the maximum, the radius of curvature of the base layer 120 may be about 0.5 R or more, for example. In an exemplary embodiment, the radius of curvature of the base layer 120 may be about 0.5 R to about 1.5 R, for example. Here, the radius of curvature of the base layer 120 may be the radius of curvature of the adhesive surface where the base layer 120 and the adhesive layer 110 are attached.

When the protection film 10 is folded to the maximum, the side surfaces of the adhesive layer 110 may be inclined due to tensile stress and compressive stress existing in the adhesive layer 110. In this case, under the condition that the radius of curvature of the adhesive layer 110 is 0.5 R or more, an angle θ defined by a tangent to a side surface of the base layer 120 and an inclined surface of the adhesive layer 110 may be 2 degrees or more, for example. In an exemplary embodiment, the angle θ may be 3 degrees to 25 degrees, for example.

Referring to FIG. 6, the illustrated graph represents a first experimental example and shows the tensile stress in the adhesive layer 110 and the tensile strain of the adhesive layer 110 in a case where the organic light emitting display device 20 to which the protection film 10 has been attached is repeatedly folded and unfolded as illustrated in FIGS. 4 and 5. Here, the tensile strain is the ratio of the increase in length caused by applied tensile load to the original length.

Referring to a solid line graph (cyclic test) of FIG. 6, when no force is applied to the protection film 10 (when the protection film 10 is attached flat as in FIG. 3), tensile stress applied to the adhesive layer 110 may be close to 0 MPa. When the protection film 10 starts to be folded due to an external force as illustrated in FIG. 4, the tensile strain may increase, and the tensile stress of the adhesive layer 110 may increase. When the protection film 10 starts to be unfolded due to an external force as illustrated in FIG. 5, the tensile strain may increase, and the tensile stress of the adhesive layer 110 may decrease. In the case of FIG. 5, the tensile strain is reduced because the protection film 10 returns to its original shape as it is unfolded. At this time, since the shape of the adhesive layer 110 is partially restored, the tensile strain is partially reduced together with the tensile stress. However, in the case of FIG. 5, the tensile strain of the adhesive layer 110 may not be restored to 0% because deformation exceeding a restoration critical point has occurred. Although not illustrated in the drawing, when the folding and unfolding of the protection film 10 are repeated, the tensile strain may become close to a maximum tensile strain.

Here, when the protection film 10 exceeds the maximum tensile strain, the adhesive layer 110 may buckle.

Referring to a dotted line graph (tensile test) of FIG. 6, when the process of folding and unfolding the protection film 10 once is referred to as a cycle, maximum tensile stress per cycle may exist. The protection film 10 may include the maximum tensile stress per cycle when it is folded to the maximum. The maximum tensile stress per cycle may increase sharply until it reaches about 200 MPa, but may increase gradually from 200 MPa or more, for example. That is, the rate of change in the maximum tensile stress per cycle may start to be reduced from around 200 MPa, for example.

FIG. 6 is an exemplary graph for explaining the change in the tensile strain of the protection film 10 and the tensile stress in the protection film 10 when the process of folding and unfolding the protection film 10 is repeated. The tensile strain of the protection film 10 and the tensile stress inside the protection film 10 are not limited to values indicated by this graph in all experimental examples. In an exemplary embodiment, the rate of change in the tensile stress inside the protection film 10 may start to be reduced from around a value other than about 200 MPa, and the tensile strain of the protection film 10 may increase or decrease at a larger rate of change or may increase or decrease at a smaller rate of change, for example.

Referring to FIG. 7, a number of experiments were conducted to identify the usable thickness of the adhesive layer 110 and the maximum compressive strain of the adhesive layer 110 according to the modulus and thickness of the base layer 120 under a high temperature condition of about 65° C. when the base layer 120 had a radius of curvature of 1.5 R. The graph of experimental results illustrated in FIG. 7 shows the maximum compressive strain of the adhesive layer 110 after the organic light emitting display device 20 to which the protection film 10 has been attached is folded and unfolded more than 1000 times as illustrated in FIGS. 4 to 6. The compressive strain is a strain according to external compressive stress and may have a sign opposite to that of the tensile strain of FIG. 6. In the experiments, an experimenter attached adhesive layers 110 having thicknesses of about 25 µm, about 35 µm, about 50 µm, about 75 µm and about 100 µm to the base layer 120 in order to identify the maximum compressive strain of each adhesive layer 110 and whether each adhesive layer 110 buckled. In the graph of FIG. 7, the horizontal axis represents the thickness of the adhesive layer 110, and the vertical axis represents the maximum compressive strain of the adhesive layer 110. For ease of description, the maximum compressive strain will be described based on an absolute value.

A protection film 10_2 according to a second experimental example includes a base layer 120 having a thickness of about 25 µm and a modulus of about 4.15 GPa. Referring to the second experimental example, as the thickness of the adhesive layer 110 increases, the maximum compressive strain of the adhesive layer 110 increases from about 0.51% at a thickness of 25 µm of the adhesive layer 110. However, when the thickness of the adhesive layer 110 was about 75 µm and about 100 µm, the adhesive layer 110 buckled.

A protection film 10_3 according to a third experimental example includes a base layer 120 having a thickness of about 35 µm and a modulus of about 4.15 GPa. Referring to the third experimental example, as the thickness of the adhesive layer 110 increases, the maximum compressive strain of the adhesive layer 110 increases from about 0.50% at a thickness of 25 µm of the adhesive layer 110. In the third experimental example, the maximum compressive strain of the adhesive layer 110 has a smaller value at each thickness of the adhesive layer 110 than in the second experimental example. When the thickness of the adhesive layer 110 was about 75 µm and about 100 µm, the adhesive layer 110 buckled.

A protection film 10_4 according to a fourth experimental example includes a base layer 120 having a thickness of about 40 µm and a modulus of about 4.15 GPa. Referring to the fourth experimental example, as the thickness of the adhesive layer 110 increases, the maximum compressive strain of the adhesive layer 110 increases from about 0.49% at a thickness of 25 µm of the adhesive layer 110. In the fourth experimental example, the maximum compressive strain of the adhesive layer 110 has a smaller value at each thickness of the adhesive layer 110 than in the third experimental example. When the thickness of the adhesive layer 110 was about 100 µm, the adhesive layer 110 buckled.

A protection film 10_5 according to a fifth experimental example includes a base layer 120 having a thickness of about 50 µm and a modulus of about 4.15 GPa Referring to the fifth experimental example, as the thickness of the adhesive layer 110 increases, the maximum compressive strain of the adhesive layer 110 decreases from about 0.49% at a thickness of 25 µm of the adhesive layer 110 and then increases. In the fifth experimental example, the maximum compressive strain of the adhesive layer 110 has a smaller value at each thickness of the adhesive layer 110 than in the fourth experimental example. In all cases where the thickness of the adhesive layer 110 was about 25 µm, about 35 µm, about 50 µm, about 75 µm and about 100 µm, buckling did not occur.

A protection film 10_6 according to a sixth experimental example includes a base layer 120 having a thickness of about 65 µm and a modulus of about 4.15 GPa Referring to the sixth experiment example, as the thickness of the adhesive layer 110 increases, the maximum compressive strain of the adhesive layer 110 decreases from about 0.50% at a thickness of 25 µm of the adhesive layer 110 and then increases. In the sixth experimental example, the maximum compressive strain of the adhesive layer 110 does not always have a smaller value at each thickness of the adhesive layer 110 than in the fifth experimental example, but has higher values at some small thicknesses of the adhesive layer 110. In all cases where the thickness of the adhesive layer 110 was about 25 µm, about 35 µm, about 50 µm, about 75 µm and about 100 µm, buckling did not occur.

A protection film 10_7 according to a seventh experimental example includes a base layer 120 having a thickness of about 75 µm and a modulus of about 4.15 GPa. Referring to the seventh experimental example, as the thickness of the adhesive layer 110 increases, the maximum compressive strain of the adhesive layer 110 decreases from about 0.51% at a thickness of 25 µm of the adhesive layer 110 and then increases. In the seventh experimental example, the maximum compressive strain of the adhesive layer 110 does not always have a smaller value at each thickness of the adhesive layer 110 than in the sixth experimental example, but has higher values at some small thicknesses of the adhesive layer 110. In all cases where the thickness of the adhesive layer 110 was about 25 µm, about 35 µm, about 50 µm, about 75 µm and about 100 µm, buckling did not occur.

A protection film 10_8 according to an eighth experimental example includes a base layer 120 having a thickness of about 25 µm and a modulus of about 6.0 GPa. Referring to the eighth experimental example, as the thickness of the adhesive layer 110 increases, the maximum compressive strain of the adhesive layer 110 increases from about 0.445% at a thickness of 25 µm of the adhesive layer 110. In the eighth experimental example, the maximum compressive strain of the adhesive layer 110 has a smaller value at each thickness of the adhesive layer 110 than in the seventh experimental example. However, when the thickness of the adhesive layer 110 was about 75 µm and about 100 µm, the adhesive layer 110 buckled.

A protection film 10_9 according to a ninth experimental example includes a base layer 120 having a thickness of about 35 µm and a modulus of about 6.0 GPa. Referring to the ninth experimental example, as the thickness of the adhesive layer 110 increases, the maximum compressive strain of the adhesive layer 110 increases from about 0.44% at a thickness of 25 µm of the adhesive layer 110. In the ninth experimental example, the maximum compressive strain of the adhesive layer 110 has a smaller value at each thickness of the adhesive layer 110 than in the eighth experimental example. However, when the thickness of the adhesive layer 110 was about 75 µm and about 100 µm, the adhesive layer 110 buckled.

A protection film 10_10 according to a tenth experimental example includes a base layer 120 having a thickness of about 40 µm and a modulus of about 6.0 GPa. Referring to the tenth experimental example, as the thickness of the adhesive layer 110 increases, the maximum compressive strain of the adhesive layer 110 decreases from about 0.43% at a thickness of 25 µm of the adhesive layer 110 and then increases. In the tenth experimental example, the maximum compressive strain of the adhesive layer 110 has a smaller value at each thickness of the adhesive layer 110 than in the ninth experimental example. In all cases where the thickness of the adhesive layer 110 was about 25 μm, about 35 μm, about 50 μm, about 75 μm and about 100 μm, buckling did not occur.

A protection film 10_11 according to an eleventh experimental example includes a base layer 120 having a thickness of about 50 μm and a modulus of about 6.0 GPa. Referring to the eleventh experimental example, as the thickness of the adhesive layer 110 increases, the maximum compressive strain of the adhesive layer 110 decreases from about 0.43% at a thickness of 25 μm of the adhesive layer 110 and then increases. In the eleventh experimental example, the maximum compressive strain of the adhesive layer 110 has a smaller value at each thickness of the adhesive layer 110 than in the tenth experimental example. In all cases where the thickness of the adhesive layer 110 was about 25 μm, about 35 μm, about 50 μm, about 75 μm and about 100 μm, buckling did not occur.

A protection film 10_12 according to a twelfth experimental example includes a base layer 120 having a thickness of about 65 μm and a modulus of about 6.0 GPa. Referring to the twelfth experimental example, as the thickness of the adhesive layer 110 increases, the maximum compressive strain of the adhesive layer 110 decreases from about 0.44% at a thickness of 25 μm of the adhesive layer 110 and then increases. In the twelfth experimental example, the maximum compressive strain of the adhesive layer 110 does not always have a smaller value at each thickness of the adhesive layer 110 than in the eleventh experimental example, but has higher values at some small thicknesses of the adhesive layer 110. In all cases where the thickness of the adhesive layer 110 was about 25 μm, about 35 μm, about 50 μm, about 75 μm and about 100 μm, buckling did not occur.

A protection film 10_13 according to a thirteenth experimental example includes a base layer 120 having a thickness of about 25 μm and a modulus of about 9.0 GPa. Referring to the thirteenth experimental example, as the thickness of the adhesive layer 110 increases, the maximum compressive strain of the adhesive layer 110 increases from about 0.38% at a thickness of 25 μm of the adhesive layer 110. In the thirteenth experimental example, the maximum compressive strain of the adhesive layer 110 has a smaller value at each thickness of the adhesive layer 110 than in the twelfth experimental example. However, when the thickness of the adhesive layer 110 was about 75 μm and about 100 μm, the adhesive layer 110 buckled.

A protection film 10_14 according to a fourteenth experimental example includes a base layer 120 having a thickness of about 35 μm and a modulus of about 9.0 GPa. Referring to the fourteenth experimental example, as the thickness of the adhesive layer 110 increases, the maximum compressive strain of the adhesive layer 110 increases from about 0.37% at a thickness of 25 μm of the adhesive layer 110. In the fourteenth experimental example, the maximum compressive strain of the adhesive layer 110 has a smaller value at each thickness of the adhesive layer 110 than in the thirteenth experimental example. However, when the thickness of the adhesive layer 110 was about 100 μm, the adhesive layer 110 buckled.

A protection film 10_15 according to a fifteenth experimental example includes a base layer 120 having a thickness of about 40 μm and a modulus of about 9.0 GPa. Referring to the fifteenth experimental example, as the thickness of the adhesive layer 110 increases, the maximum compressive strain of the adhesive layer 110 decreases from about 0.36% at a thickness of 25 μm of the adhesive layer 110 and then increases. In the fifteenth experimental example, the maximum compressive strain of the adhesive layer 110 has a smaller value at each thickness of the adhesive layer 110 than in the fourteenth experimental example. In all cases where the thickness of the adhesive layer 110 was about 25 μm, about 35 μm, about 50 μm, about 75 μm and about 100 μm, buckling did not occur.

In addition to the above experimental examples, various other experiments show that the maximum compressive strain of the adhesive layer 110 substantially decreases as the modulus of the base layer 120 increases and substantially decreases as the thickness of the adhesive layer 110 decreases.

Experiments were conducted to identify the relationship between the modulus and thickness of the base layer 120 and the maximum usable thickness of the adhesive layer 110. In the experiments, as in the above-described experimental examples, values were measured under a high temperature condition of about 65° C. when the radius of curvature of the base layer 120 was about 1.5 R. The results of the experiments are shown in Table 1 below. The values shown in Table 1 are approximate values, and some minor errors may exist.

TABLE 1

| Maximum usable thickness of adhesive layer, z [μm] | | | |
| --- | --- | --- | --- |
| Thickness of base layer, y [μm] | Modulus of base layer; when x [GPa] = 4.15, | If x [GPa] = 6.0, | If x [GPa] = 9.0, |
| 35 | 77 | 84 | 94 |
| 40 | 87 | 96 | 108 |
| 50 | 104 | 116 | 131 |
| 65 | 124 | 139 | 158 |
| 75 | 135 | 151 | 173 |

When the base layer 120 had a thickness of about 35 μm and a modulus of about 4.15 GPa, the maximum usable thickness of the adhesive layer 110 could be about 77 μm. When the base layer 120 had a thickness of about 35 μm and a modulus of about 6.0 GPa, the maximum usable thickness of the adhesive layer 110 could be about 84 μm. When the base layer 120 had a thickness of about 35 μm and a modulus of about 9.0 GPa, the maximum usable thickness of the adhesive layer 110 could be about 94 μm. When the base layer 120 had a thickness of about 40 μm and a modulus of about 4.15 GPa, the maximum usable thickness of the adhesive layer 110 could be about 87 μm. When the base layer 120 had a thickness of about 40 μm and a modulus of about 6.0 GPa, the maximum usable thickness of the adhesive layer 110 could be about 96 μm. When the base layer 120 had a thickness of about 40 μm and a modulus of about 9.0 GPa, the maximum usable thickness of the adhesive layer 110 could be about 108 μm. When the base layer 120 had a thickness of about 50 μm and a modulus of about 4.15 GPa, the maximum usable thickness of the adhesive layer 110 could be about 104 μm. When the base layer 120 had a thickness of about 50 μm and a modulus of about 6.0 GPa, the maximum usable thickness of the adhesive layer 110 could be about 116 μm. When the base layer 120 had a thickness of about 50 μm and a modulus of about 9.0 GPa, the maximum usable thickness of the adhesive layer 110 could be about 131 μm. When the base layer 120 had a thickness of about 65 μm and a modulus of about 4.15 GPa, the maximum usable thickness of the adhesive layer 110 could be about 124 µm. When the base layer 120 had a thickness of about 65 µm and a modulus of about 6.0 GPa, the maximum usable thickness of the adhesive layer 110 could be about 139 µm. When the base layer 120 had a thickness of about 65 µm and a modulus of about 9.0 GPa, the maximum usable thickness of the adhesive layer 110 could be about 158 µm. When the base layer 120 had a thickness of about 75 µm and a modulus of about 4.15 GPa, the maximum usable thickness of the adhesive layer 110 could be about 135 µm. When the base layer 120 had a thickness of about 75 µm and a modulus of about 6.0 GPa, the maximum usable thickness of the adhesive layer 110 could be about 151 µm. When the base layer 120 had a thickness of about 75 µm and a modulus of about 9.0 GPa, the maximum usable thickness of the adhesive layer 110 could be about 173 µm.

In addition to the experimental examples of Table 1, various other experiments showed that the maximum usable thickness of the adhesive layer 110 according to the modulus of the base layer 120 and the thickness of the base layer 120 substantially satisfied Equation 3 below. In addition, the relationship between the base layer 120 and the adhesive layer 110 satisfied Equation 3 when the radius of curvature of the base layer 120 was about 0.5 R or more, the thickness of the base layer 120 was about 25 µm to about 75 µm, the modulus of the base layer 120 was about 2 GPa to about 9 GPa, and the temperature was about −40° C. to about 65° C.

$$z = (5.1x + 57.4) \cdot \ln(y) - (14.7x + 140.5). \quad (3)$$

In Table 1 and Equation 3 above, x is the modulus value of the base layer 120 measured in GPa, y is the thickness value of the base layer 120 measured in µm, and z is the maximum usable thickness of the adhesive layer 110 measured in µm.

The maximum usable thickness z1 of the adhesive layer 110 of FIG. 1 may be a value (z=z1) calculated by applying Equation 3 to the thickness (y=y1) of the base layer 120 at a modulus value (x=x1) of the base layer 120. That is, the relationship between z1 and y1 may satisfy Equation 4 below.

$$z_1 = (5.1x_1 + 57.4) \cdot \ln(y_1) - (14.7x_1 + 140.5). \quad (4)$$

In the case of the protection film 10 according to the exemplary embodiment of FIG. 1, z1 satisfying Equation 4 corresponds to the maximum usable thickness of the adhesive layer 110. Therefore, when the adhesive layer 110 of the protection film 10 has a thickness of z1 or less, buckling may not occur even when the protection film 10 is repeatedly folded and unfolded more than 1000 times, for example.

However, referring to FIG. 8 as a comparative example, the protection film 10_1 may include the adhesive layer 110_1 having a thickness exceeding z1 that satisfies Equation 4. When the protection film 10_1 is repeatedly folded and unfolded more than 1000 times, for example, buckling of the adhesive layer 110_1 may occur in a folding and unfolding region. The buckling may occur mostly near the boundary of a bent portion. Here, the buckling may occur not only near the boundary on one side of the bent portion as illustrated in the drawing, but also near the boundary on the other side of the bent portion. However, since the buckling does not occur when the protection film 10_1 is used in a flexible display device or a rigid display device instead of the foldable organic light emitting display device 20, it is possible to prevent the organic light emitting display device 20 from being damaged.

Next, the impact resistance performance of the organic light emitting display device 20 according to the characteristics of the base layer 120 and the thickness of the adhesive layer 110 will be described.

After protection films 10 according to sixteenth through nineteenth experimental examples were attached to the organic light emitting display device 20, a DuPont impact test and a pen drop test were conducted. In the DuPont impact test, a precision weight of 30 gram (g) was dropped to measure a height in terms of centimeters that caused bright dots to be provided on the organic light emitting display device 20. In the pen drop test, a height that caused the cover window 250 of the organic light emitting display device 20 to be broken was measured using a BIC ball pen having a weight of about 5.8 g and distributed by Lazy Society Co., Ltd. In a comparative example, the DuPont impact test and the pen drop test were conducted on the organic light emitting display device 20 without the protection film 10. The experimental results are shown in Table 2 below. The values shown in Table 2 are approximate values, and some minor errors may exist.

TABLE 2

|  | Comparative example | Sixteenth experimental example | Seventeenth experimental example | Eighteenth experimental example | Nineteenth experimental example |
|---|---|---|---|---|---|
| DuPont impact test | Bright dots at 2 cm | Bright dots at 5 cm | Bright dots at 7 cm | Bright dots at 3 cm | Bright dots at 4 cm |
| Pen drop test | Broken at 1 cm | Broken at 13 cm | Broken at 16 cm | Broken at 16 cm | Broken at 8 cm |

As described above, the comparative example was conducted without attaching the protection film 10 to the organic light emitting display device 20. Here, in the sixteenth experimental example, a protection film 10 including a base layer 120 having a thickness of about 40 µm and a modulus of about 4.15 GPa and an adhesive layer 110 having a thickness of about 50 µm were attached. In the seventeenth experimental example, a protection film 10 including a base layer 120 having a thickness of about 40 µm and a modulus of about 4.15 GPa and an adhesive layer 110 having a thickness of about 100 µm were attached. In the eighteenth experimental example, a protection film 10 including a base layer 120 having a thickness of about 50 µm and a modulus of about 4.15 GPa and an adhesive layer 110 having a thickness of about 50 µm were attached. In the nineteenth experimental example, a protection film 10 including a base layer 120 having a thickness of about 25 µm and a modulus of about 1.5 GPa and an adhesive layer 110 having a thickness of about 50 µm were attached.

According to the above experiments, in the case of the DuPont impact test, the height that caused bright dots to be provided increased as the thickness of the adhesive layer 110 increased. In the case of the pen drop test, the cover window 250 of the organic light emitting display device 20 was very vulnerable when the protection film 10 was not attached, but the height that caused the cover window 250 to be broken increased sharply as the modulus of the base layer 120 and the thickness of the protection film 10 increased.

Therefore, a damage to the organic light emitting display device 20 due to an external impact may be reduced when the protection film 10 includes an adhesive layer 110 having a maximum thickness that does not cause buckling according to the modulus and thickness of the base layer 120.

Protection films according to other exemplary embodiments will now be described. In the following embodiments, a redundant description of elements and features identical to those described above with reference to FIGS. 1 through 8 will be omitted. In addition, the same reference numerals will be used for the same elements as those described above with reference to FIGS. 1 through 3.

Figure 9:
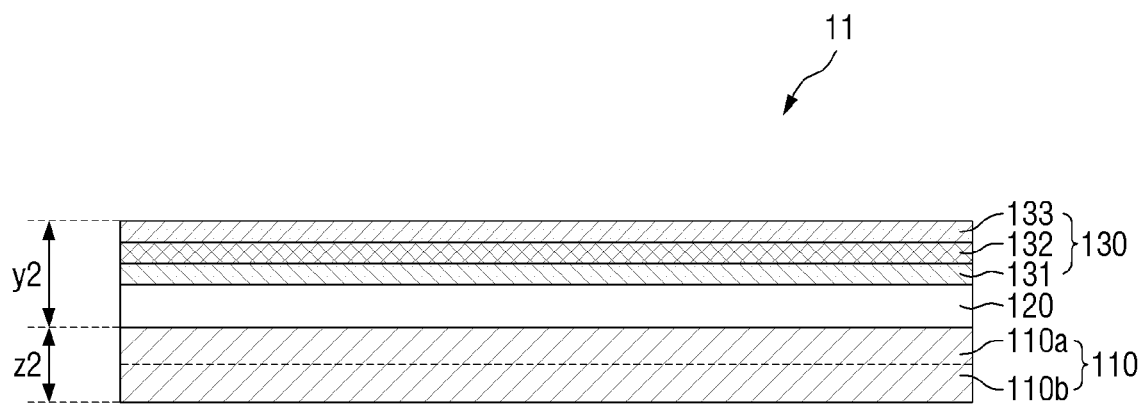
FIG. 9 is a cross-sectional view of an exemplary embodiment of a protection film.

FIG. 9 is a cross-sectional view of a protection film 11 according to an exemplary embodiment.

Referring to FIG. 9, the protection film 11 is different from the protection film 10 of FIG. 1 in that a functional layer 130 is further attached onto a base layer 120.

The protection film 11 may include an adhesive layer 110, the base layer 120, and the functional layer 130. The base layer 120 may be disposed on the adhesive layer 110, and the functional layer 130 may be disposed on the base layer 120.

The functional layer 130 may include any one or more of an anti-fingerprint coating layer, an anti-fouling coating layer, an anti-reflection coating layer, an anti-glare coating layer, a hard-coating layer, and a self-restoring layer. The illustrated exemplary embodiment to be described below merely explains a structure in which the functional layer 130 includes a hard-coating layer 131, an anti-fingerprint coating layer 132 and a self-restoring layer 133 and is not limited to this structure.

The hard-coating layer 131 may be disposed on the base layer 120. The hard-coating layer 131 disposed on the base layer 120 may reduce the distortion or lifting phenomenon of the protection film 11 under severe conditions such as high temperature or high temperature and high humidity, thereby improving reliability.

Although not illustrated, the hard-coating layer 131 may include an organic layer and an organic-inorganic composite layer. Here, the organic layer may include an acrylate-based compound. In an exemplary embodiment, the organic layer may include urethane acrylate, for example. The organic layer may be disposed between the base layer 120 and the organic-inorganic composite layer to serve as a stress buffer layer. In an exemplary embodiment, the organic layer may have a thickness of about 20 μm or less, for example.

An organic material in the organic-inorganic composite layer may include at least one or a combination of an acrylate-based compound, a polyurethane-based compound, and an epoxy-based compound. In an exemplary embodiment, first and second organic-inorganic composite layers may include urethane acrylate, for example. In an exemplary embodiment, an inorganic material in the organic-inorganic composite layer may be at least any one of silicon oxide ($SiO_2$), zirconium oxide ($ZrO_2$), aluminum oxide ($Al_2O_3$), tantalum oxide ($Ta_2O_5$), niobium oxide ($Nb_2O_5$, $NbO_2$), and glass bead, for example.

The inorganic material may be provided in the form of a single kind of inorganic oxide listed or a combination of these materials. In addition, the inorganic material may be provided in various forms to form the organic-inorganic composite layer. In an exemplary embodiment, silicon oxide may be provided in the form of $SiO_2$ particles, a $SiO_2$ sol in which $SiO_2$ particles are dispersed in a colloidal state, or $SiO_2$ having a hollow shape, for example.

In the organic-inorganic composite layer, an acrylate compound (i.e., an organic material) and inorganic particles may be mixed in a weight ratio of 5:5 to 8:2, for example. By including both the acrylate compound and the inorganic particles, the organic-inorganic composite layer may form the hard-coating layer 131 that has improved surface hardness and is not easily broken due to its ability to absorb external shock.

The anti-fingerprint coating layer 132 may be disposed on the hard-coating layer 131. In an exemplary embodiment, the anti-fingerprint coating layer 132 is provided by providing a coating material including perfluoropolyether using a spray coating method and thermally curing the coating material at about 60° C. for about 60 minutes, for example. In an exemplary embodiment, the provided anti-fingerprint coating layer 132 may have a thickness of about 50 μm, for example. The anti-fingerprint coating layer 132 may be provided using not only the above-described method, but also using various methods.

The self-restoring layer 133 may be disposed on the anti-fingerprint coating layer 132. The self-restoring layer 133 is provided using a self-restoring composition including aromatic urethane acrylate resins. In the self-restoring layer 133, the urethane acrylate resins may be included in a ladder structure that may be supported by an aromatic group, a heteroaromatic group, or both. The aromatic urethane acrylate resins may be urethane acrylate resins having 2 to 5 functional groups on average, may be provided by reacting a polymerizable composition including acrylate, which includes a hydroxyl group, and an isocyanate compound, and at least one of the acrylate including the hydroxyl group and the isocyanate compound may include an aromatic group, a heteroaromatic group, or both.

In an exemplary embodiment, the thickness of the self-restoring layer 133 may be about 15 μm to about 40 μm, for example. By having a thickness within the above range, the self-restoring layer 133 may exhibit sufficient bending and self-restoring properties without excessively increasing the total thickness of the protection film 11. Thus, the self-restoring layer 133 may have uniform performance over a long period of time.

As in the exemplary embodiment of FIG. 1, in the protection film 11 including the functional layer 130, the maximum usable thickness of the adhesive layer 110 may be applied according to Equation 3 regarding the relationship between the base layer 120 and the adhesive layer 110 when the radius of curvature of the base layer 120 is about 0.5 R or more, the thickness of the base layer 120 is about 25 μm to about 75 μm, the modulus of the base layer 120 is about 2 GPa to about 9 GPa, and the temperature is about −40° C. to about 65° C., for example. In an exemplary embodiment, the maximum usable thickness of the adhesive layer 110 of the protection film 11 according to the illustrated exemplary embodiment may satisfy Equation 5 below.

$$z_2 = (5.1x_1 + 57.4)\cdot \ln(y_2) - (14.7x_2 + 140.5), \quad (5)$$

where x2 is the modulus of the base layer 120. Here, y2 is a value obtained by adding not only the thickness of the base layer 120 but also the thickness of the functional layer 130. That is, y2 may be the total thickness of all layers stacked on the adhesive layer 110. In an exemplary embodiment, since all layers stacked on the adhesive layer 110 include only the base layer 120 in FIG. 1, y1 may be the thickness of the base layer 120, for example. In the illustrated exemplary embodiment, since all layers stacked on the adhesive layer 110 include the base layer 120 and the functional layer 130, 2 may be the sum of the thickness of the base layer 120 and the thickness of the functional layer 130.

When the thickness of the adhesive layer 110 is z2 or less, buckling may not occur in the protection film 11.

As in the exemplary embodiment of FIG. 1, a damage to the organic light emitting display device 20 due to an external impact may be reduced when the protection film 11 including the adhesive layer 110 of the maximum usable thickness is attached to the organic light emitting display device 20.

Figure 10:
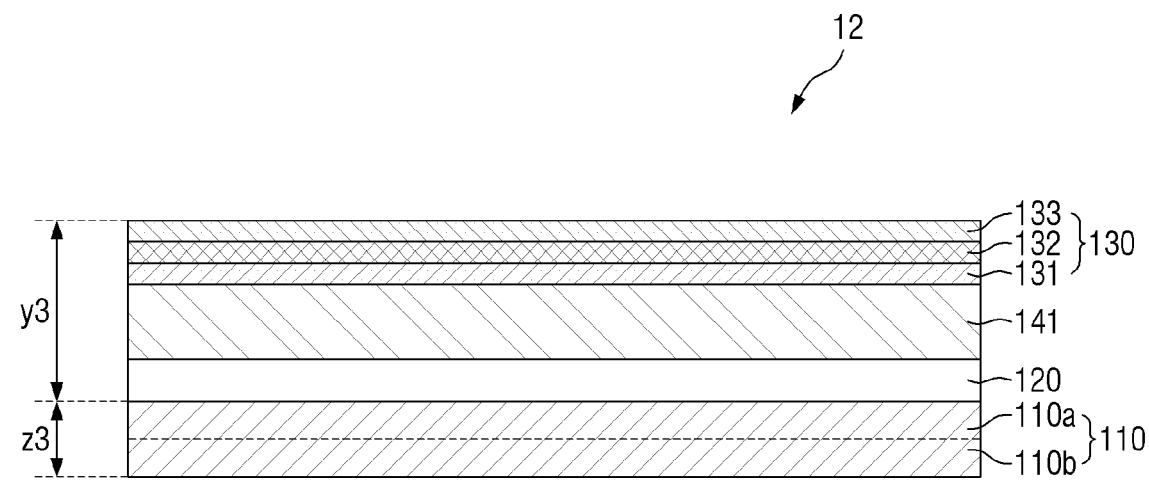
FIG. 10 is a cross-sectional view of an exemplary embodiment of a protection film.

FIG. 10 is a cross-sectional view of a protection film 12 according to an exemplary embodiment. Referring to FIG. 10, the protection film 12 according to the illustrated exemplary embodiment is different from the protection film 11 of FIG. 9 in that it further includes a primer layer 141 disposed between a base layer 120 and a functional layer 130. The primer layer 141 may be an adhesion-assisting layer for enhancing the adhesion between the base layer 120 and a hard-coating layer 131.

The protection film 12 of the illustrated exemplary embodiment may further include the primer layer 141 between the functional layer 130 and the base layer 120. Specifically, the primer layer 141 may be disposed between the base layer 120 and the hard-coating layer 131. In an exemplary embodiment, the primer layer 141 may include a silane coupling agent and isocyanate, for example.

In an exemplary embodiment, the primer layer 141 may have a thickness of 10 nanometers (nm) to 30 nm, for example. When the primer layer 141 is provided thinner than 10 nm, its function as an adhesion-assisting layer may deteriorate, thus weakening the adhesion to the functional layer 130. In addition, when the primer layer 141 is provided thicker than 30 nm, a haze phenomenon may occur, thus degrading optical characteristics of the primer layer 141.

As in the exemplary embodiment of FIG. 1, in the protection film 12 including the primer layer 141, the maximum usable thickness of an adhesive layer 110 may be applied according to Equation 3 regarding the relationship between the base layer 120 and the adhesive layer 110 when the radius of curvature of the base layer 120 is about 0.5 R or more, the thickness of the base layer 120 is about 25 μm to about 75 μm, the modulus of the base layer 120 is about 2 GPa to about 9 GPa, and the temperature is about −40° C. to about 65° C., for example. In an exemplary embodiment, the maximum usable thickness of the adhesive layer 110 of the protection film 12 according to the illustrated exemplary embodiment may satisfy Equation 6 below.

$$z_3 = (5.1x_3 + 57.4) \cdot \ln(y_3) - (14.7x_3 + 140.5),. \tag{6}$$

where x3 is the modulus of the base layer 120. Since y3 is the total thickness of all layers stacked on the adhesive layer 110, it may be, for example, the sum of the thickness of the base layer 120, the thickness of the primer layer 141, and the thickness of the functional layer 130.

When the thickness of the adhesive layer 110 is z3 or less, buckling may not occur in the protection film 12.

As in the exemplary embodiment of FIG. 1, a damage to the organic light emitting display device 20 due to an external impact may be reduced when the protection film 12 including the adhesive layer 110 of the maximum usable thickness is attached to the organic light emitting display device 20.

A protective film may have excellent durability for a long period of time and protect an electronic device from the outside.

However, the effects of the invention is not restricted to the one set forth herein. The above and other effects of the exemplary embodiments will become more apparent to one of daily skill in the art to which the exemplary embodiments pertain by referencing the claims.

What is claimed is:

1. A display device comprising:
a substrate;
a light emitting layer on the substrate;
an encapsulation layer on the light emitting layer;
a touch sensing layer on the encapsulation layer;
a cover window on the touch sensing layer; and
a protection film on the cover window,
wherein the protection film includes a base layer and an adhesive layer on the base layer,
the adhesive is disposed between the cover window and the base layer,
the base layer has a modulus of about 2 gigapascals to about 9 gigapascals,
the base layer has a thickness of about 25 micrometers to 75 micrometers,
the adhesive layer has a modulus of about 10 megapascals or less at a temperature of −20 degrees Celsius or lower, and
the adhesive layer has a thickness of 100 micrometers or more.

2. The display device of claim 1, wherein the adhesive layer comprises an acrylic-based adhesive.

3. The display device of claim 1, wherein the encapsulation layer comprises a thin film including an inorganic material and a thin film including an organic material.

4. The display device of claim 1, wherein the encapsulation layer comprises:
a first inorganic layer on the touch sensing layer;
an organic layer on first inorganic layer; and
a second inorganic layer on the organic layer.

5. The display device of claim 1, wherein the thickness of the adhesive layer satisfies Inequality (1):

$$z \le (5.1x + 57.4) \cdot \ln(y) - (14.7x + 140.5), \tag{1}$$

where z is the thickness of the adhesive layer in terms of micrometers and equal to or greater than 100 micrometers, x is a modulus of the base layer in terms of gigapascals, and y is a total thickness of the protection film layer in terms of micrometers,
(5.1x+57.4)·ln(y)−(14.7x+140.5) is greater than zero, and
a temperature is about −40° C. to about 65° C.

6. A display device comprising:
a substrate;
a light emitting layer on the substrate;
an encapsulation layer on the light emitting layer;
a touch sensing layer on the encapsulation layer;
a cover window on the touch sensing layer; and
a protection film on the cover window, wherein the protection film comprises a base layer, a hard-coating layer on a first surface of the base layer, and an adhesive layer on a second surface of the base layer, the second surface facing the cover window, the base layer has a modulus of about 2 gigapascals to about 9 gigapascals, the base layer has a thickness of about 25 micrometers to 75 micrometers, the adhesive layer has a modulus of about 10 megapascals or less at a temperature of −20 degrees Celsius or lower, and the adhesive layer has a thickness of 100 micrometers or more.

7. The display device of claim 6, wherein the hard-coating layer comprises an organic layer.

8. The display device of claim 7, wherein the organic layer includes an acrylate-based compound.

9. The display device of claim 7, further comprising an organic-inorganic composite layer.

10. The display device of claim 6, wherein the thickness of the adhesive layer satisfies Inequality (2):

$$z \leq (5.1x + 57.4) \cdot \ln(y) - (14.7x + 140.5), \qquad (2)$$

where z is the thickness of the adhesive layer in terms of micrometers and equal to or greater than 100 micrometers, x is a modulus of the base layer in terms of gigapascals, and y is a total thickness of the protection film layer in terms of micrometers, $(5.1x+57.4)\cdot\ln(y)-(14.7x+140.5)$ is greater than zero, and a temperature is about −40° C. to about 65° C.

11. A display device comprising:
a display panel;
a window on the display panel; and
a protection film layer on the window, wherein the protection film comprises a base layer, a first functional layer on a first surface of the base layer, and an adhesive layer on a second surface of the base layer, the second surface facing the window, wherein a thickness of the adhesive layer satisfies Inequality (3):

$$z \leq (5.1x + 57.4) \cdot \ln(y) - (14.7x + 140.5), \qquad (3)$$

where z is the thickness of the adhesive layer in terms of micrometers, x is a modulus of the base layer in terms of gigapascals, and y is a total thickness of the protection film layer in terms of micrometers, $(5.1x+57.4)\cdot\ln(y)-(14.7x+140.5)$ is greater than zero, and a temperature is about −40° C. to about 65° C., the thickness of the adhesive layer is about 25 micrometers or more, and the protection film further comprises a second functional layer on the first functional layer.

12. The display device of claim 11, wherein the first functional layer comprises an organic layer including an acrylate-based compound.

13. The display device of claim 12, wherein the first functional layer further comprises an organic-inorganic composite layer.

14. The display device of claim 11, wherein the first functional layer is a hard-coating layer and the second functional layer is an anti-fingerprint coating layer.

15. The display device of claim 11, wherein the protection film further comprises a third functional layer, which is a self-restoring layer, on the second functional layer.

* * * * *